United States Patent [19]

Porat

[11] 3,944,777

[45] Mar. 16, 1976

[54] METHOD FOR JOINING RESISTIVE AND CONDUCTIVE MATERIALS

[76] Inventor: David Porat, 17 Englewood Ave., Brookline, Mass. 02146

[22] Filed: Dec. 13, 1974

[21] Appl. No.: 532,739

[52] U.S. Cl. .................... 219/118; 219/85; 219/91
[51] Int. Cl.² ......................................... B23K 11/20
[58] Field of Search .................... 219/85 F, 91, 118

[56] References Cited
UNITED STATES PATENTS

| | | | |
|---|---|---|---|
| 1,056,061 | 3/1913 | Rogers | 219/91 |
| 1,568,080 | 1/1926 | Meadowcroft | 219/118 |
| 3,231,710 | 1/1966 | Barnet et al. | 219/91 |
| 3,381,081 | 4/1968 | Schalliol | 219/85 F X |
| 3,666,913 | 5/1972 | Haefling et al. | 219/118 |

*Primary Examiner*—J. V. Truhe
*Assistant Examiner*—Nathan D. Herkamp
*Attorney, Agent, or Firm*—Kenyon & Kenyon Reilly Carr & Chapin

[57] ABSTRACT

A method for joining, by molecular diffusion, an element of greater electrical resistance to a surface of substantially lesser electrical resistance. A piece of resistive material capable of being spot welded to the element of greater electrical resistance is placed in contact with both the surface having substantially lesser electrical resistance and the element having the greater electrical resistance. The resistive piece and the resistive element are spot welded to each other, whereby the heat from that spot weld causes the conductive material to be joined to the piece of resistive material by molecular diffusion. The method is particularly useful for joining nichrome wire to copper-clad printed circuit boards and for joining metal fasteners to copper and aluminum sheet metal surfaces.

10 Claims, 6 Drawing Figures

METHOD FOR JOINING RESISTIVE AND CONDUCTIVE MATERIALS

BACKGROUND OF THE INVENTION

This invention relates to resistance welding and particularly to a method for joining elements of greater electrical resistance to surfaces of substantially lesser electrical resistance.

In general, methods for spot welding materials to a high quality electrical conductor such as copper or aluminum are limited by the bulk resistance and low contact resistance of the conductor. With a typical fuse-limited current supply, the maximum heat available for welding is directly proportional to the resistance placed across the welding electrodes. Copper and aluminum, being among the best conductors of electricity known, have such low resistance that extremely high current circuits were thought to be necessary to supply sufficient heat to form a junction. In addition to the special wiring required for such high current circuits, earlier inventors had to provide complex electronic means for limiting pulse voltage surges during welding. See U.S. Pat. No. 3,207,884. Alternatively, some inventors allowed the elements intended to be joined to be partly destroyed by the high current as a means for limiting current or voltage surges. See U.S. Pat. No. 3,466,419.

In the method described in U.S. Pat. No. 3,466,419, useful only for attaching conductive elements to fine resistive wire wound coils, it is necessary first to use a large current to burn a hole through the conductive element which will raise the element's resistance and then to pass a current through the fine resistive wire causing that wire to burn through, leaving its ends fused to the edges of the burn hole. That method breaks the continuity of the wire and produces a junction area limited to the tip of the wire and the rim of the hole. That method also required that the electrodes used to pass current through the conductive element be closely spaced. This spacing must be of the order of the thickness of the conductive surface and is a critical dimension in the prior art. In addition, since the electrodes carrying these high currents were themselves made of copper they would have to be sufficiently massive to act as heat sinks in order to avoid heating to a point where they would be fused to the circuit. The use of these massive electrodes was not advantageous where one of the elements to be fused was itself a massive conductive element such as a sheet of conductive metal.

Another serious restriction upon the utility of all prior art spot welding methods is that by relying on ohmic heating in a highly conductive material it was not possible to maintain the surface of the conductor relatively cool near the electrodes. Thus prior art devices tended to be characterized by burning the junction, a need to maintain critically small distances between electrodes and overheating the conductor away from the area where the junction was being formed.

In addition, although nichrome wire carrying an electric current is common in heating elements said wire commonly having the shape of a ribbon, it is presently considered unsuitable for use in conjunction with copper clad printed or semiconductor control circuits because of the difficulties of making a nichrome-copper connection that will withstand high temperatures. At present such connections are either made as elaborate and unsatisfactory mechanically crimped connections or through the use of adhesives. This has prevented the economical use of semiconductor circuitry in connection with heating elements.

The heating industry often manufactures large duct surfaces to specifications calling for highly conductive materials such as aluminum or copper having resistivities of the order of 1–3 microhm-cm. For purposes of installation or of the attachment of insulation to these ducts it is necessary to join these duct surfaces to metal fasteners having resistivities of the order of 10–150 microhm-cm. Presently, the mass production of these duct systems is made expensive and not fully satisfactory by having to adhesively join the resistive and nonresistive metals. Welding is unsuitable for this task because the low conductivity of the duct walls would necessitate the use of unrealistically large currents attendant with all the drawbacks in the prior art just discussed.

SUMMARY OF THE INVENTION

The present invention solves the above noted problems by providing a method for joining elements having resistivities in the range 10–150 microhm-cm, hereinafter called resistive elements, to the surface of a material having its resistivity less than 3 microhm-cm, hereinafter called a conductive surface. Examples of resistive elements are those fashioned from nichrome or steel. Examples of conductive surfaces are those fashioned from aluminum or copper. The method finds particular application in joining copper clad printed control circuits to nichrome wire heating elements or in joining heating duct surfaces to steel fasteners.

In carrying out the method of the present invention a piece of resistive material is placed on the conductive surface and in contact with the resistive element. A current is then passed through both the piece of resistive material and the resistive element causing them to be spot welded to each other and giving rise to heat that is transferred to the conductive surface causing it to be joined to the piece of resistive material by diffusion.

One advantage of this method is that since the area that diffuses is confined to the surface of the piece of resistive material it is possible to control the extent of that area by appropriately choosing the size and shape of the piece. Another advantage of this method is that heat from the spot weld tends to be confined to the area of the resistive element and piece. Even though the spot welding current may pass through the conductive surface there will not be significant ohmic heating of the conductive surface away from the piece at the relatively low current densities which this method requires. These current densities also permit the method to be used without burning away portions of the elements to be joined, making this method particularly suitable to fine circuits. The method also is not sensitive to either the spacing between the electrodes used to supply the spot welding current nor to the pressure of the electrodes against the various surfaces. Thus this method permits the use of standard spot welding equipment without the need for complex circuits to control current surges. The method also is not sensitive to the electrical properties of the elements so long as they have properties capable of resistive welding.

Other advantages of the method will appear hereinafter.

DETAILED DESCRIPTION OF THE PREFERRED EMBODIMENT

Figure 1:
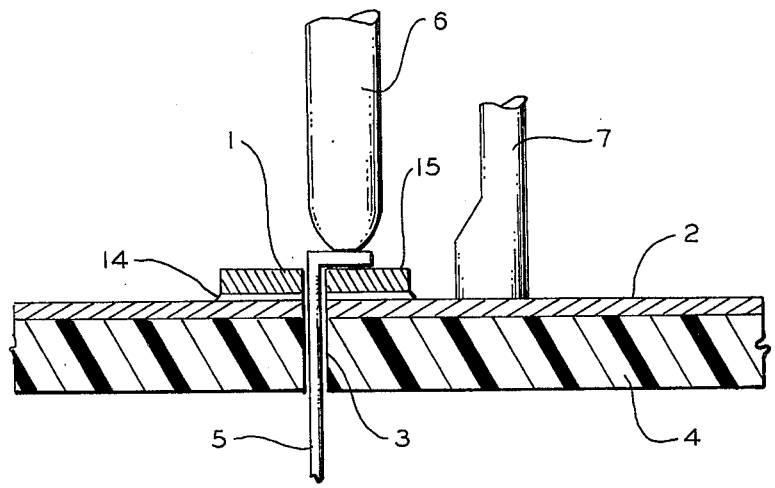
FIG. 1 is a sectional view illustrating the method of the present invention used to join a nichrome wire to a copper clad circuit board.

In general the method of the present invention depends upon the conduction of heat from the resistance welding of a resistive element and a piece of resistive material to cause the diffusion of a portion of a conductive surface into the piece. Referring to FIG. 1, a ferrous metal piece, preferably a steel washer 1 having sufficient annular area to form a low resistance junction is placed flat on a perforated circuit board comprised of a layer of copper 2 on a phenolic substrate 4. The washer 1 has its hole aligned with the perforation 3 in the circuit board. A nichrome wire 5 is inserted through both the perforation in the circuit board and the hole in the washer and bent over to touch the exposed surface 15 of the washer. A copper electrode 6 is placed on the nichrome wire 5 where it touches the exposed surface of the washer and another electrode 7 is placed on the copper surface 2. The shape of the electrodes may be trimmed so as to permit intimate contact with the elements. The electrodes are connected to a conventional current supply for spot welding equipment. For nichrome wire with diameters between 0.005 to 0.031 inch and copper layers with a thickness from 0.003 to 0.007 inch it is found that a 120 volt circuit fused at 30 amps is sufficient, but this by no means is a restriction of this invention. With proper pulse intensity and duration easily found in conventional fashion by those skilled in the art, this method can be used on heavier guages of wire and plate. As the current is applied the wire 5 is spot welded to the washer 1 and the copper diffuses into the washer throughout a region 14. When the region 14 has a well-defined meniscus the current to the welding electrodes is interrupted and the electrodes removed from contact. The surfaces are then allowed to cool.

Figure 2:
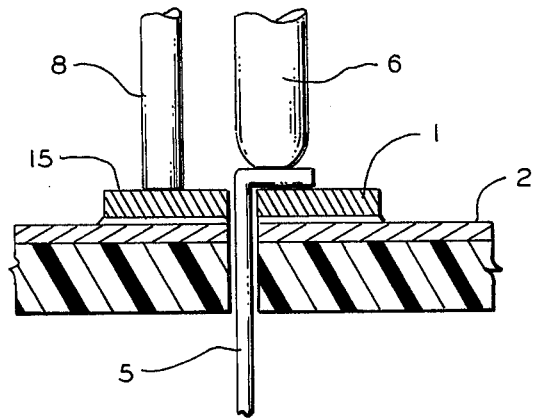
FIG. 2 is a sectional view illustrating a second embodiment of the method of the present invention used to join a nichrome wire to a copper clad circuit board.

FIG. 2 shows a second embodiment of the method of the present invention differing from the method of FIG. 1 only in having one electrode 8 placed upon the upper surface 15 of the washer 1. This embodiment minimizes the current flow into the copper surface 2 which is an advantage if sensitive electronic components are connected to the copper.

Figure 3:
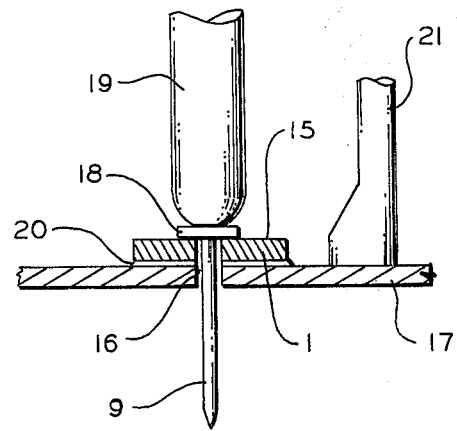
FIG. 3 is a sectional view illustrating a first embodiment of the method of the present invention used to join a nail to a copper or aluminum sheet.

The method is also well suited for attaching a fastener to a sheet metal structure which is a good conductor. Referring to FIG. 3 a steel washer 1 is placed flat on a substantially planar portion of a copper or aluminum surface 17, with its hole aligned with a perforation 16 in the surface. A steel nail 9 is inserted through the aligned holes from the washer end so that a substantial portion of its shank extends beyond the surface 17 and its head 18 lies flush against the top surface 15 of the washer 1. One electrode 19 is placed against the head of the nail 18 and the other 21 against the surface 17. Then, as current is passed between the two electrodes the nail 9 is spot welded to the washer 1 and the copper or aluminum diffuses into the washer throughout a region 20. When the region 20 has a well defined meniscus the current to the welding electrodes is interrupted and the electrodes removed from contact. The surfaces are then allowed to cool.

Figure 3A:
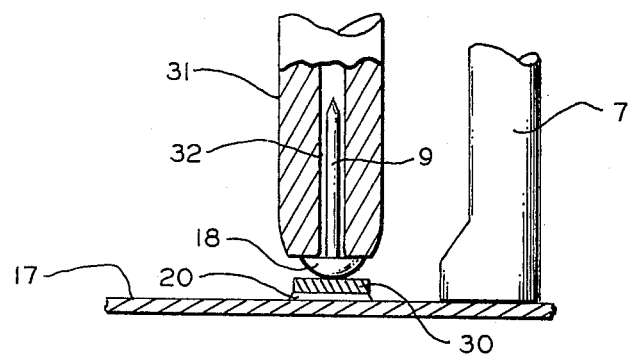
FIG. 3A is a sectional view illustrating a second embodiment of the method of the present invention used to join a nail to a copper or aluminum sheet.

A second embodiment of the method of the present invention for attaching a fastener to a sheet metal structure which is a good conductor is shown in FIG. 3A. In this embodiment a steel disc 30 is placed flat on a substantially planar portion of a copper or aluminum surface 17. A steel nail 9 or other substantially slender fastener such as a brad, spike, or tack is placed orthogonal to the surface with its head 18 in contact with the top surface of the disc 30. One electrode 31 having a channel 32 drilled therein to receive the nail rests against the head of the nail. Another electrode 7 rests on the surface 17. Current is passed between the two electrodes and the nail 9 is spot welded to the disc 30 and the copper or aluminum diffuses into the disc throughout a region 20. When the region 20 has a well defined meniscus the current to the welding electrodes is interrupted and the electrodes removed from contact. The surfaces are then allowed to cool.

Figure 4:
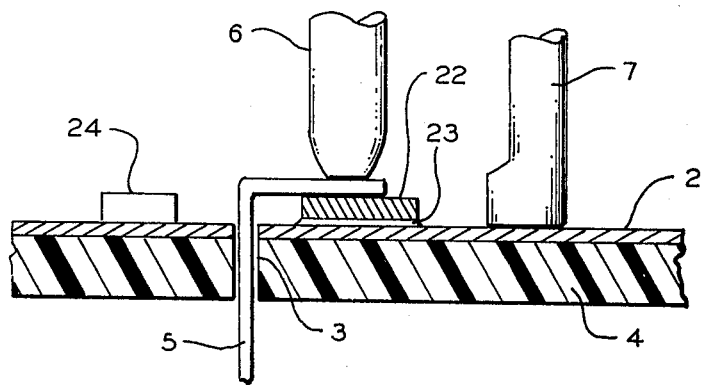
FIG. 4 is a sectional view illustrating a third embodiment of the method of the present invention to join a nichrome wire to a copper clad circuit board.

The method of the present invention may be performed in an embodiment using pieces of resistive material whose shape is chosen to control the location of the junction. Referring to FIG. 4, a third embodiment of the method suitable for joining nichrome wire to copper clad circuit board is shown. In this embodiment a solid disc-like piece 22 is placed near a perforation 3 in the circuit board. The nichrome wire 5 is inserted through perforation 3 and bent over so as to contact the upper surface of piece 22. From that point the method is essentially identical to that discussed in connection with FIG. 1. Here, however, the junction region 23 does not enclose the nichrome wire but lies entirely to one side. This embodiment would be particularly advantageous if a heat or electrically sensitive element 24 were near the point of entry of the wire through the circuit board.

Figure 5:
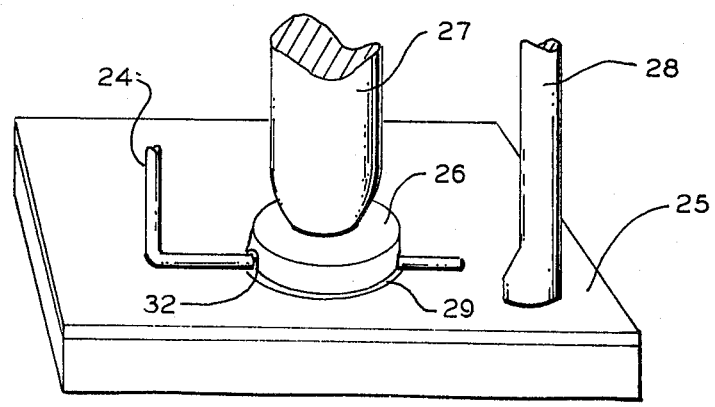
FIG. 5 is a perspective view illustrating a fourth embodiment of the method of the present invention to join a nichrome wire to a copper clad circuit board.

The method of the present invention may be performed entirely from one side of the conductive surface. This versatility is useful for automating the assembly of congested circuit designs. Referring to FIG. 5, a nichrome wire 24 is placed in contact with the copper surface 25 of a circuit board. A metal piece 26 with a groove 32 cut in its lower surface to receive the wire is placed on the copper surface 25 over and in contact with the wire 24. One electrode 27 is placed on the upper surface of the piece 26 and another electrode 28 is placed on the copper surface 25. A current is applied as in the other embodiments of this method until a meniscus 29 appears at the base of the piece. Then the current is interrupted, the electrodes removed and the piece allowed to cool. Because of the masses involved the cooling is almost instantaneous.

The junctions formed in any of these examples of embodiments of the present invention are mechanically strong and have low electrical resistance.

The present invention may be embodied in other specific forms not departing from the essential attributes of the invention, which are defined in the following claims.

I claim:
1. A method for joining a resistive element to a surface of a conductive material comprising
   a. placing a piece of resistive material so that a portion of its surface is in contact with the surface of the conductive material;
   b. placing the resistive element in contact with the piece of resistive material; and
   c. passing a current through both the piece of resistive material and the resistive element of sufficient magnitude to spot weld them together,
whereby the piece of resistive material and the resistive element will be spot welded to each other and heat from that spot weld will thereby cause the conductive material to be joined to the piece of resistive material by diffusion.

2. The method according to claim 1 wherein:
   a. the resistive element has a wirelike shape and
   b. the conductive material has a substantially planar surface.

3. The method according to claim 2 wherein said substantially planar surface has at least one perforation therein large enough to pass the resistive element, and further including the step of passing the resistive element through the perforation in the substantially planar surface.

4. The method according to claim 1 wherein:
   a. said resistive element is a fastener; and
   b. said conductive material is a portion of a structure to be joined to other material by said fastener; and
   c. said step of passing a current is accomplished by means of two electrodes.

5. The method according to claim 4 where
   a. said fastener has a substantially slender shape;
   b. said portion of structure has at least one perforation therein large enough to pass a substantial portion of said fastener, and
   c. a substantial portion of said fastener passes through the perforation in said portion of a structure.

6. A method for joining a resistive element, having a wirelike shape, to a conductive material, having a substantially planar surface with at least one perforation therein large enough to pass the resistive element, comprising
   a. placing on the planar surface of the conductive material a piece of resistive material having a hole therein large enough to pass the resistive element so that said hole is aligned with a perforation;
   b. passing the resistive element through said perforation and said hole;
   c. bending said resistive element so that it makes contact with one surface of said piece; and
   d. passing a current through both said piece and said resistive element of sufficient magnitude to spot weld them together,
whereby said piece and said resistive element will be spot welded to each other and heat from that spot weld will thereby cause the conductive material to be joined to said piece by diffusion.

7. The method according to claim 6 where the step of passing a current is accomplished by means of two electrodes, one of which is in contact with the surface of the conductive material.

8. A method for joining a nichrome wire to a copper clad circuit board on a base material such as phenolic having at least one perforation therein large enough to pass said wire comprising
   a. placing on the circuit board a washer made of a ferrous metal having a hole therein large enough to pass the wire so that said hole is aligned with a perforation,
   b. passing the nichrome wire through said perforation and said hole,
   c. bending said wire so that it makes contact with one surface of said washer and
   d. passing a current through both said washer and said wire of sufficient magnitude to spot weld them together by means of two electrodes, one of which is in contact with said circuit board,
whereby said washer and said wire will be spot welded to each other and heat from that spot weld will thereby cause said circuit board to be joined to said piece by diffusion.

9. A method for joining a resistive metal nail to a surface of a structure fashioned from conductive sheet metal to be joined to other material by said nail comprising
   a. placing a piece of resistive material so that a portion of its surface is in contact with the surface of the structure;
   b. placing the nail with its head contacting said piece of resistive material;
   c. placing a first electrode in contact with the structure;
   d. placing a second electrode, formed to receive said nail into its interior, so that it makes good electrical contact with the head of said nail;
   e. passing a current through both said piece of resistive material and said nail, by means of said first and second electrodes, of sufficient magnitude to spot weld them together,
whereby the piece of resistive material and the nail will be spot welded to each other and heat from that spot weld will thereby cause said structure to be joined to said piece of resistive material by diffusion.

10. A method for joining a resistive metal fastener, having a head and a substantially slender shape, to a surface of a structure to be joined to other material by said fastener, having at least one perforation in said structure large enough to pass a substantial portion of said fastener, comprising
   a. placing a piece of resistive material, having a hole therein large eneough to pass a substantial portion of said fastener, on the surface of the structure with its hole aligned with a perforation;
   b. placing the resistive metal fastener so that a substantial portion thereof passes through said perforation and said hole and so that said head remains in contact with one surface of said piece;
   c. passing a current by means of two electrodes through both said piece and said fastener of sufficient magnitude to spot weld them together,
whereby the piece of resistive material and the fastener will be spot welded to each other and heat from that spot weld will thereby cause said surface of said structure to be joined to the piece of resistive material by diffusion.

* * * * *